(12) United States Patent
Iwasaki et al.

(10) Patent No.: US 9,754,772 B2
(45) Date of Patent: Sep. 5, 2017

(54) CHARGED PARTICLE IMAGE MEASURING DEVICE AND IMAGING MASS SPECTROMETRY APPARATUS

(71) Applicant: CANON KABUSHIKI KAISHA, Tokyo (JP)

(72) Inventors: Kota Iwasaki, Atsugi (JP); Hiroyuki Hashimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/253,344

(22) Filed: Aug. 31, 2016

(65) Prior Publication Data
US 2017/0062196 A1 Mar. 2, 2017

(30) Foreign Application Priority Data

Sep. 2, 2015 (JP) ................................. 2015-173269
Aug. 4, 2016 (JP) ................................. 2016-153915

(51) Int. Cl.
*H01J 49/00* (2006.01)
*H01J 49/16* (2006.01)
*H01J 49/06* (2006.01)
*H01J 37/244* (2006.01)
*H01J 37/12* (2006.01)
*H01J 37/141* (2006.01)
*H01J 49/14* (2006.01)

(52) U.S. Cl.
CPC .......... *H01J 49/0004* (2013.01); *H01J 37/12* (2013.01); *H01J 37/141* (2013.01); *H01J 37/244* (2013.01); *H01J 49/06* (2013.01); *H01J 49/142* (2013.01); *H01J 49/161* (2013.01); *H01J 2237/226* (2013.01)

(58) Field of Classification Search
USPC .............................. 250/281, 282, 287, 396 R
See application file for complete search history.

(56) References Cited

U.S. PATENT DOCUMENTS

| 4,564,758 | A | * | 1/1986 | Slodzian | H01J 37/026 250/281 |
| 5,128,543 | A | * | 7/1992 | Reed | H01J 37/256 250/287 |
| 5,506,414 | A | * | 4/1996 | Coxon | H01J 37/06 250/305 |
| 9,570,276 | B2 | * | 2/2017 | Iwasaki | H01J 37/252 |

FOREIGN PATENT DOCUMENTS

JP 2014514591 A 6/2014

* cited by examiner

*Primary Examiner* — Kiet T Nguyen
(74) *Attorney, Agent, or Firm* — Canon U.S.A. Inc., IP Division

(57) ABSTRACT

A charged particle image measuring device includes a sample stage, a charged particle lens opposite the sample stage, a two-dimensional detector, a first diaphragm disposed between the sample stage and a position of a crossover that is formed by the charged particle lens and that is closest to a sample, and a second diaphragm disposed between the first diaphragm and the two-dimensional detector.

15 Claims, 9 Drawing Sheets

411

412

91

92

93

CHARGED PARTICLE IMAGE MEASURING DEVICE AND IMAGING MASS SPECTROMETRY APPARATUS

BACKGROUND OF THE INVENTION

Field of the Invention

An embodiment of the present invention relates to a charged particle image measuring device and an imaging mass spectrometry apparatus.

Description of the Related Art

"Imaging mass spectrometry" is receiving attention as a technique for detecting substance distribution of a biological sample. In general, mass spectrometry is a method that ionizes a sample by irradiating the sample with a primary beam of laser light, ions, or electrons, separates ions emitted from the sample by their mass-to-charge (m/z) ratios, and obtains a spectrum consisting of mass-to-charge ratios and detected intensity thereof. In imaging mass spectrometry, the surface of a sample is two-dimensionally mass-analyzed, and the distribution of substances on the surface of the sample, that is, "mass image" is obtained.

There are two types of methods of imaging in imaging mass spectrometry: a scanning type imaging mass spectrometry and a projection type imaging mass spectrometry.

The scanning type imaging mass spectrometry is a method that sequentially mass-analyzes micro regions on a sample, and reconstructs a mass image from the result of mass spectrometry and the positional information of the micro regions. In the scanning type, spatial resolution depends on the size or the like of micro regions, and is determined by the beam diameter of the primary beam and the scanning position accuracy of the primary beam.

In the projection type imaging mass spectrometry, predetermined regions on a sample are collectively ionized, and an image of emitted ions is formed on a two-dimensional detector by a charged particle lens. In the projection type imaging mass spectrometry, emitted ions from the surface of the sample are also mass separated while the ions are flying, eventually mass images are obtained (PCT Japanese Translation Patent Publication No. 2014-514591). The spatial resolution in the projection type imaging mass spectrometry is determined by the accuracy of measurement of ion arrival position in the two-dimensional detector and the magnification, aberration, and the like of the charged particle lens.

High spatial resolution has been desired in imaging mass spectrometry.

SUMMARY OF THE INVENTION

In an aspect of the present invention, a charged particle image measuring device includes a sample stage, a charged particle lens opposite the sample stage, a two-dimensional detector, a first diaphragm disposed between the sample stage and a position of a crossover that is formed by the charged particle lens and that is closest to a sample, and a second diaphragm disposed between the first diaphragm and the two-dimensional detector.

Further features of the present invention will become apparent from the following description of exemplary embodiments with reference to the attached drawings.

DESCRIPTION OF THE EMBODIMENTS

When ions are emitted from the surface of a sample, the emitted ions are often ununiform in kinetic energy and emission angle when being emitted from the sample. Because the kinetic energy and emission angle of ions emitted from the sample are determined by various factors such as the substance existing on the sample, and the type, energy, and angle of incidence of the primary beam, the kinetic energy and emission angle are difficult to rigorously control. Since ions emitted from the sample are ununiform in kinetic energy and emission angle as described above, there is a problem in that the aberration of the charged particle lens increases, and the spatial resolution is deteriorated.

In view of the above issue, an embodiment of the present invention provides a charged particle image measuring device capable of high spatial resolution imaging mass spectrometry.

Embodiments of the present invention will now be described in detail. However, the present invention is not limited to the embodiments described below. Changes, modifications, and the like appropriately made in the embodiments described below without departing from the spirit thereof and on the basis of the ordinary knowledge of those skilled in the art are also included in the scope of the embodiments of the present invention.

First Embodiment

An imaging mass spectrometry apparatus having a charged particle image measuring device according to a first embodiment will be described with reference to FIGS. 1A to 3C and FIGS. 7A to 7G.

Configuration

Figure 1A:
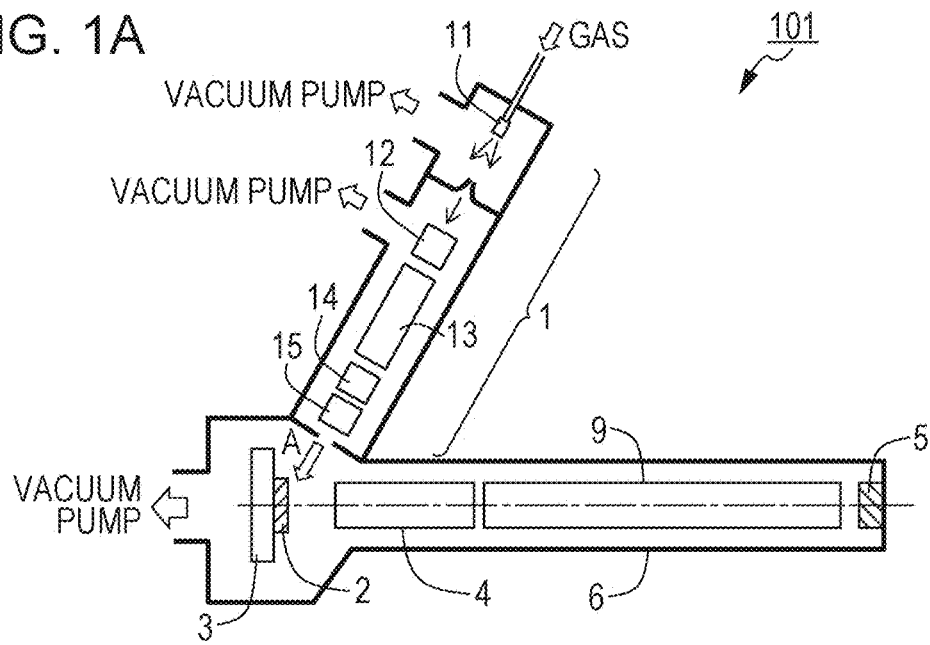
FIG. 1A is a diagram schematically showing the configuration of an imaging mass spectrometry apparatus having a charged particle image measuring device according to a first embodiment.
Figure 1B:
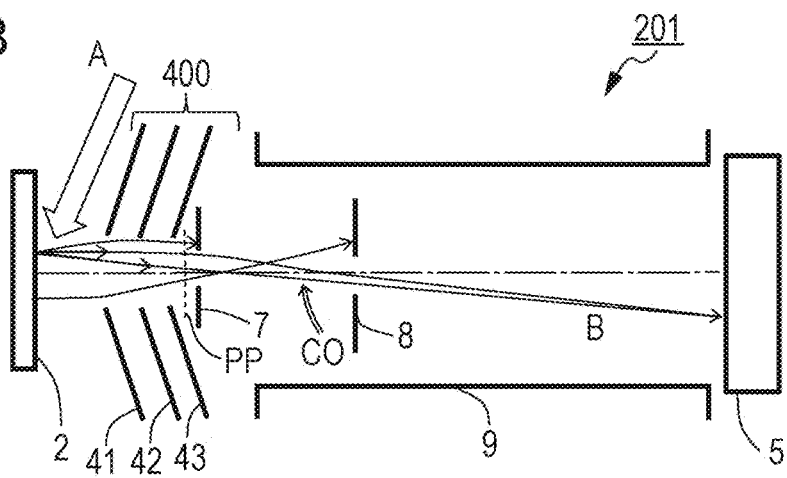
FIG. 1B is a diagram schematically showing the configuration of the charged particle image measuring device according to the first embodiment.

FIG. 1A is a diagram schematically showing the configuration of an imaging mass spectrometry apparatus having a charged particle image measuring device according to this embodiment. FIG. 1B is a diagram schematically showing the configuration of the charged particle image measuring device according to this embodiment.

As shown in FIG. 1A, an imaging mass spectrometry apparatus 101 (hereinafter referred to as "spectrometry apparatus 101") according to this embodiment includes an ion gun 1 that is an ionizing portion, and a charged particle image measuring device 201 (hereinafter referred to as "image measuring device 201"). As shown in FIG. 1B, the image measuring device 201 has a sample stage 3 for holding a sample 2, a charged particle lens 4, a first diaphragm 7, a second diaphragm 8, and a two-dimensional detector 5 (hereinafter referred to as "detector 5"). The image measuring device 201 may further have a flight tube electrode 9. Respective parts of the image measuring device 201 form or are included in a vacuum chamber 6. Although not shown in FIG. 1A, the spectrometry apparatus 101 has a vacuum evacuation system, a power supply defining the potential of each electrode, and a signal processing system. It is preferable that the gas in the vacuum chamber 6 be evacuated by the vacuum evacuation system and the inside of the vacuum chamber 6 be kept in a high vacuum state.

In this embodiment, a time-of-flight mass spectrometer is formed by the charged particle lens 4, the flight tube electrode 9, and the detector 5. Charged particles are focused onto the surface of the detector 5, and the coordinate and time of detection of charged particles including secondary ions at the surface of the detector 5 are recorded.

The components of the spectrometry apparatus 101 will be described in detail below.

Ion Gun

The ion gun 1 irradiates the sample 2 held by the sample stage 3 with an ion beam. The ion gun 1 is an ionizing portion that ionizes the sample 2 held by the sample stage 3 and causes the sample 2 to emit ions, which are charged particles. Although a cluster ion gun that supplies cluster ions generated from various gases is used as an example in this embodiment, the ion gun 1 is not limited to this. An ion gun that supplies molecular ions or fullerene ions, a liquid metal ion source, a duoplasmatron, a surface ionization type ion source, or the like may be used as the ion gun 1. As described later, instead of the ion gun 1, the spectrometry apparatus 101 may have, as an ionizing portion, a laser light source that irradiates the sample 2 held by the sample stage 3 with laser light or an electron gun that irradiates the sample 2 held by the sample stage 3 with an electron beam.

In this embodiment, the sample 2 is irradiated with an ion beam using the ion gun 1, the sample 2 is thereby ionized, and ions derived from the sample 2 are generated. In general, ions with which the sample 2 is irradiated are referred to as primary ions, and ions generated from the sample 2 by irradiating the sample 2 with the primary ions are referred to as secondary ions. A method that detects and analyzes the thus generated secondary ions with a mass spectrometer is referred to as secondary ion mass spectrometry (SIMS). That is, the spectrometry apparatus 101 according to this embodiment is a secondary ion mass spectrometry apparatus.

As shown in FIG. 1A, the ion gun 1 has a nozzle 11, an ionizing portion 12, a mass selector 13, a chopper 14, and a primary ion lens 15.

The nozzle 11 is supplied, through a gas introduction pipe, with noble gas such as Ar, Ne, He, or Kr, molecular gas such as $CO_2$, $CO$, $N_2$, $O_2$, $NO_2$, $SF_6$, $Cl_2$, or $NH_4$, alcohol such as ethanol, methanol, or isopropyl alcohol, water, or the like. The water or alcohol may be mixed with an acid or base. The gas introduction pressure is not particularly limited, but is preferably in a range between 0.001 atm and 100 atm, and more preferably between 0.1 atm and 20 atm.

When gas is jetted from the nozzle 11 into the vacuum, the supplied gas or liquid is accelerated to supersonic velocity. On this occasion, the gas is cooled by adiabatic expansion, and gas containing clusters, which are aggregates of atoms or molecules, is generated. At least either the clusters or the gas enters the ionizing portion 12. An electron source such as a hot filament is disposed in the ionizing portion 12. The atoms or molecules forming the clusters are ionized by electrons generated in the electron source, and cluster ions are generated.

Cluster ions and monomer ions having various sizes are generated in the ionizing portion 12, and they are appropriately accelerated and then enter the mass selector 13. The cluster ions and monomer ions entering the mass selector 13 are sorted according to mass-to-charge ratio by the mass selector 13, and a cluster ion beam (ion beam A) having a desired size (mass) is generated. The mass selector 13 may be any one of a time-of-flight type, a quadrupole type, and a magnetic field type.

The ion beam A is pulsed in the chopper 14. If, instead of the chopper 14, a nozzle that jets gas in a pulsed manner or an ionizing portion that ionizes clusters in a pulsed manner is used, a pulsed ion beam A can also be obtained. The chopper 14 is preferably capable of high-speed pulse driving so that the pulse width is about several tens of ns or less.

The acceleration energy of the ion beam A is several keV to several tens of keV in this embodiment, but may be several tens of keV or more from the perspective of improving the convergence of the primary ion beam and the secondary ion generation efficiency.

The pulsed ion beam A is accelerated as described above, and is then appropriately converged by the primary ion lens 15, and the sample 2 is irradiated with the ion beam A. As a result, neutral particles, electrons, secondary ions, and the like are emitted from the surface of the sample 2. The size of a region on the surface of the sample 2 that is irradiated with the ion beam A (the irradiation spot of the ion beam A) may be equal to or larger than the size of the opening of the charged particle lens 4.

Sample Stage

The sample stage 3 holds a sample 2 that is analyzed by the spectrometry apparatus 101. The sample stage 3 is configured to be movable relative to the ion gun 1. The region on the sample 2 that is irradiated with the ion beam A by the ion gun 1 can thereby be shifted.

Charged Particle Lens

The charged particle lens 4 projects and focuses secondary ions B generated from the sample 2 onto the detector 5. The charged particle lens 4 is an electrostatic lens. The charged particle lens 4 is disposed opposite the sample stage 3. In this embodiment, as shown in FIG. 1B, the charged particle lens 4 is a threefold charged particle lens 4 consisting of three electrodes: an extraction electrode 41, a first lens electrode 42, and a second lens electrode 43.

Figure 2A:
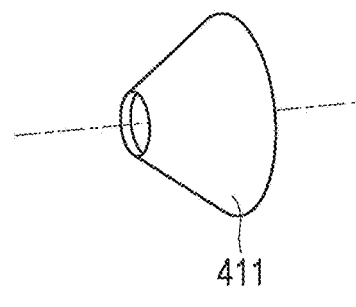
FIG. 2A is a diagram schematically showing the shape of a conical electrode.
Figure 2B:
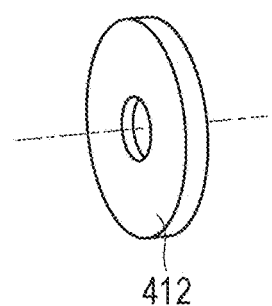
FIG. 2B is a diagram schematically showing the shape of an aperture electrode.
Figure 2C:
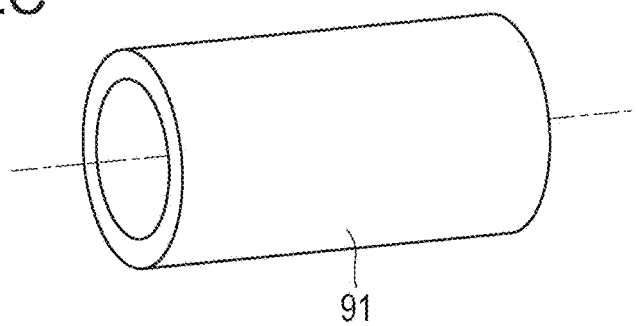
FIG. 2C is a diagram schematically showing the shape of a cylindrical electrode.

The shape of the electrodes forming the charged particle lens 4 (lens electrodes) is not particularly limited as long as the lens electrodes have an opening for passing charged particles therethrough. That is, each lens electrode may be a conical electrode 411 having an opening (FIG. 2A), a disk-shaped electrode having an opening (aperture electrode 412) (FIG. 2B), or a cylindrical electrode (FIG. 2C).

When driving the charged particle lens 4, a power supply (not shown) applies an appropriate voltage to each of the electrodes forming the charged particle lens 4. In particular, the potential of the extraction electrode 41, which is closest to the sample 2, relative to the sample 2 is referred to as extraction voltage, and the electric field formed therebetween is referred to as extraction electric field. The secondary ions B emitted from the sample 2 are accelerated by the extraction electric field and enter the charged particle lens 4. After that, the secondary ions B are converged by an electric field formed by the extraction electrode 41, the first lens electrode 42, and the second lens electrode 43. The converged secondary ions B fly on the ion optical axis 44 of the charged particle lens 4 toward the flight tube electrode 9 that is located on the opposite side of the charged particle lens 4 from the sample 2.

In this embodiment, conical electrodes are used as an example of lens electrodes forming the charged particle lens 4. In particular, when the extraction electrode 41 is a conical electrode, and a part corresponding to the apex of the conical electrode is disposed opposite the sample 2, the extraction electric field of a part of the conical electrode that is far from the opening is weak compared to the extraction electric field in the vicinity of the opening. As a result, the deflection of the trajectory of the primary ions due to the extraction electric field, and the deformation of the beam are eased.

Flight Tube Electrode

Figure 2D:
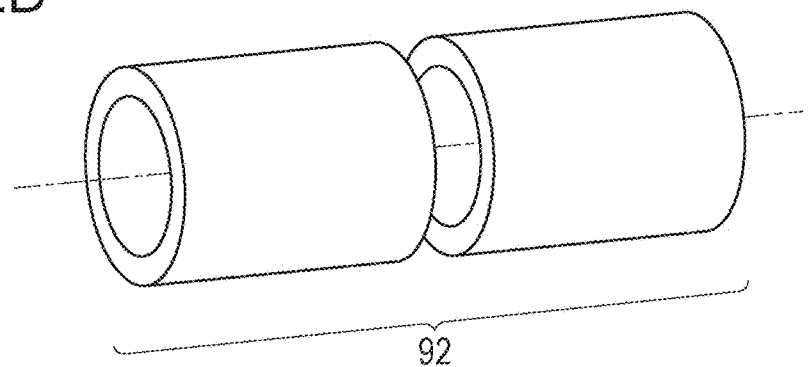
FIG. 2D is a diagram schematically showing the structure of a flight tube electrode consisting of cylindrical electrodes.
Figure 2E:
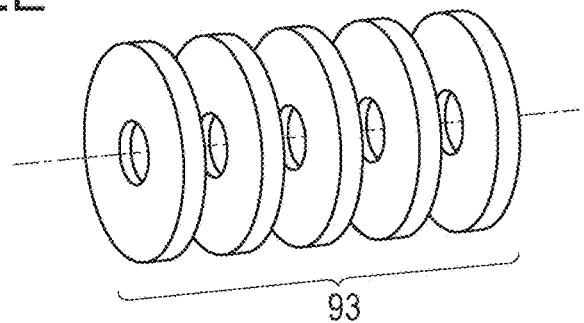
FIG. 2E is a diagram schematically showing the structure of a flight tube electrode consisting of a stack of aperture electrodes.

The flight tube electrode 9 is an electrode having an equipotential space therein. Therefore, charged particles flying through the flight tube electrode 9 fly at a uniform velocity. Although a cylindrical flight tube electrode that is a cylindrical electrode is used as the flight tube electrode 9 in this embodiment, a flight tube electrode consisting of a plurality of cylindrical electrodes may also be used (FIG. 2D). Alternatively, an aperture type flight tube electrode consisting of a stack of aperture electrodes may also be used (FIG. 2E).

Figure 1C:
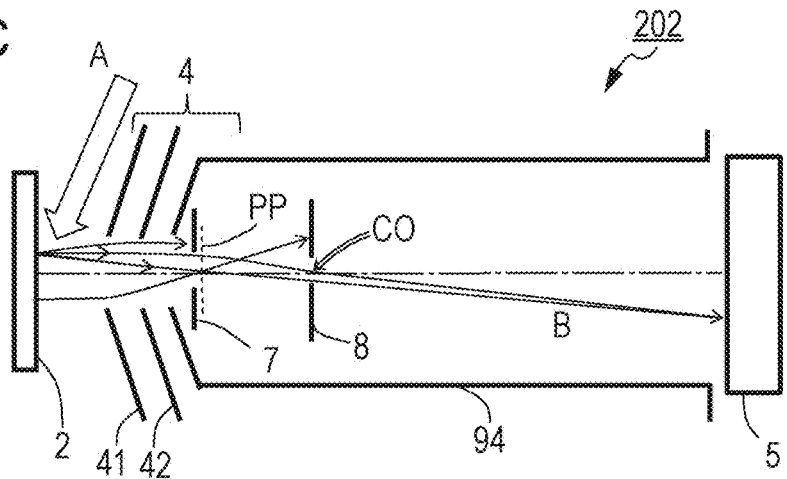
FIG. 1C is a diagram schematically showing the configuration of a charged particle image measuring device employing an apertured flight tube electrode.

Instead of the second lens electrode 43 and the flight tube electrode 9, an apertured flight tube electrode 94 that integrates the second lens electrode 43 and the flight tube electrode 9 may be used (FIG. 1C).

The secondary ions B emitted from the sample 2 are accelerated by the extraction electric field, enter the charged particle lens 4, and are then converged by an electric field formed by the extraction electrode 41, the first lens electrode 42, and the second lens electrode 43. FIG. 1B and FIG. 1C show trajectories of secondary ions B emitted from the sample 2 through the charged particle lens 4 to the detector 5. The secondary ions passing through the second lens electrode 43 enter the flight tube electrode 9 having an equipotential space therein, and move at a uniform velocity. The secondary ions passing through the flight tube electrode 9 are detected by the detector 5 disposed at the exit of the flight tube electrode 9. The time (clock time) at which the detector 5 detects the secondary ions B is transmitted to the signal processing system together with the signal intensity of the secondary ions B and the detection coordinate on the detector 5.

The elapsed time from when the secondary ions B are emitted from the sample 2 until they pass through the charged particle lens 4 and are detected by the detector 5 (time of flight) can be measured as the difference between the time of generation of the secondary ions and the time of detection by the detector 5. In this embodiment, the time at which the ion beam A is incident on the sample 2 can be treated as the time of generation at which the secondary ions are emitted. Because the flight distance of the secondary ions and the acceleration potential of the secondary ions can be known in advance, the secondary ions can be mass-analyzed.

In particular, when the flight tube electrode 9 is sufficiently long compared to the other electrodes, that is, when the distance that the secondary ions travel through the flight tube electrode 9 is sufficiently long, the mass-to-charge ratio of the secondary ions can be found from the following equation 1. That is, the mass-to-charge ratio of the secondary ions can be found approximately by substituting the length of the flight tube electrode 9 for L in equation 1 and substituting the above time of flight for t.

$$\frac{m}{z} = 2eV\left(\frac{t}{L}\right)^2 \qquad \text{(Equation 1)}$$

where m is the mass of ions, z is the valence number of ions, V is the acceleration voltage of ions, and e is the elementary charge.

As described above, the secondary ions are converged by the charged particle lens 4 while flying to the detector 5, and an image of the secondary ions on the sample 2 is formed on the surface of the detector 5. That is, a point on the surface of the sample 2 is in one-to-one correspondence with a point on the surface of the detector 5. Therefore, each point on the sample 2 that is irradiated with the ion beam A can be mass-analyzed. Consequently, imaging mass spectrometry can be performed without scanning the primary ion beam.

Diaphragms

The spectrometry apparatus 101 has a first diaphragm 7 and a second diaphragm 8. The first diaphragm 7 and the second diaphragm 8 each have an opening, and are disposed on a flight path of the secondary ions B through which the secondary ions B emitted from the sample 2 reach the detector 5. The first diaphragm 7 will be referred to herein as "field diaphragm," because the diaphragm 7 behaves as a mechanism which mainly controls the analysis field. The second diaphragm 8 will be referred to herein as "angular diaphragm," because the diaphragm 8 behaves as a mechanism which mainly controls the angle of the ions emitted from the sample 2. Secondary ion image correction by this diaphragm 8 is similar to the chromatic aberration correction used in camera.

The shape of the first diaphragm 7 and the second diaphragm 8 is not particularly limited. As with the lens electrodes forming the charged particle lens 4, the first diaphragm 7 and the second diaphragm 8 may be conical electrodes or aperture electrodes. The size of the openings of the first diaphragm 7 and the second diaphragm 8 may be smaller or larger than the size of the openings of the lens electrodes. By making the size of the openings of the first diaphragm 7 and the second diaphragm 8 smaller than the size of the openings of the lens electrodes, the aberration of the charged particle lens 4 can be reduced, and the spatial resolution can be improved.

First Diaphragm

As shown in FIG. 1B, the first diaphragm 7 is disposed between the sample stage 3 and the position of a crossover (CO) that is formed by the charged particle lens 4 and that is closest to the sample 2. The first diaphragm 7 allows at least some of the secondary ions emitted from the sample 2 to pass through an opening 7a, and a part of the first diaphragm 7 other than the opening 7a (blocking part 7b) blocks the others. Secondary ions emitted from the sample 2 and entering the charged particle lens 4 parallel to the ion optical axis of the charged particle lens 4 follow a trajectory before reaching the detector 5. A point at which this trajectory intersects the ion optical axis of the charged particle lens 4 will be referred to herein as "crossover." That is, the secondary ions emitted from the sample 2 and entering the charged particle lens 4 parallel to the ion optical axis of the charged particle lens 4 converge at the crossover.

In this embodiment, the ion gun 1 irradiates a predetermined region (irradiation region) on the sample 2 with the ion beam A to ionize the sample in the irradiation region. When the caliber of the charged particle lens 4 is larger than the irradiation region, the irradiation region is the "field of view" of the image measuring device 201. When the caliber of the charged particle lens 4, or more specifically, the caliber of the extraction electrode 41 is smaller than the irradiation region, a part of the irradiation region corresponding to the opening of the extraction electrode 41 is the "field of view" of the image measuring device 201.

When secondary ions are emitted from the sample 2, not only ions having trajectories parallel to the ion optical axis of the charged particle lens 4 but also ions having trajectories intersecting the ion optical axis at predetermined angles that are not 0° are emitted. The angle between the ions emitted from the sample 2 and the ion optical axis of the charged particle lens 4 will be referred to as "emission angle." That is, the secondary ions emitted from the sample 2 have a distribution of emission angles.

Secondary ions the emission angles of which are not 0° may enter the charged particle lens 4 even when they are generated from outside the above field of view. If commingling of secondary ions from outside the field of view occurs, noise is generated, and the spatial resolution of the obtained mass image is deteriorated. Even when the irradiation region is the "field of view," secondary ions may be generated from outside the irradiation region, and therefore the same problem arises.

So, in this embodiment, a first diaphragm 7 is disposed between the position of the crossover (CO) and the sample stage 3. Ions coming from outside the field of view can thereby be blocked by the blocking part 7b of the first diaphragm 7. As a result, the spatial resolution of the obtained mass image can be improved.

The position where the first diaphragm 7 is disposed is not particularly limited as long as it is between the position of the crossover (CO) and the sample stage 3, but is preferably in the vicinity of the position of the principal plane (PP) of the charged particle lens 4. Thereby, ions coming from outside the field of view can be effectively blocked by the blocking part 7b of the first diaphragm 7, and the spatial resolution of the obtained mass image can be further improved.

The principal plane is defined as follows. Secondary ions emitted from the sample 2 and entering the charged particle lens 4 parallel to the ion optical axis of the charged particle lens 4 follow a trajectory before reaching the detector 5. An asymptote of the trajectory of secondary ions that is extended from the sample 2 side and an asymptote of the trajectory of secondary ions that is extended from the detector 5 side are drawn. On this occasion, these two asymptotes intersect at a point of intersection. A point at which a perpendicular from this point of intersection to a central axis of the charged particle lens 4 intersects this central axis is referred to as "principal point." A plane containing the principal point and perpendicular to this central axis is referred to as "principal plane."

Second Diaphragm

As shown in FIG. 1B, the second diaphragm 8 is disposed between the first diaphragm 7 and the detector 5. The second diaphragm 8 allows at least some of the secondary ions emitted from the sample 2 to pass through an opening 8a, and a part of the second diaphragm 8 other than the opening 8a (blocking part 8b) blocks the others.

Ions the emission angles of which are 0°, that is, ions emitted from the sample 2 in trajectories parallel to the ion optical axis of the charged particle lens 4 enter the charged particle lens 4 and then converge at the crossover. After that, the ions reach an ideal position on the detector 5 that is in one-to-one correspondence with the ion emission position on the surface of the sample 2. An image of ions emitted from the sample 2 in trajectories parallel to the ion optical axis of the charged particle lens 4 is thereby formed on the surface of the detector 5.

However, when the emission angle is not 0°, ions reach a position shifted from the above ideal position on the detector 5, and the larger the emission angle, the larger the amount of shift. Therefore, a conventional charged particle image measuring device has a problem in that, when a distribution in the emission angle of secondary ions exists, the spatial resolution of the obtained mass image is deteriorated.

So, in this embodiment, a second diaphragm 8 is disposed between the first diaphragm 7 and the detector 5. Ions the emission angles of which are large can thereby be blocked by the blocking part 8b of the second diaphragm 8. As a result, the spatial resolution of the obtained mass image can be improved.

The position where the second diaphragm 8 is disposed is not particularly limited as long as it is between the first diaphragm 7 and the detector 5, and may be on the upstream side or downstream side of the position of the crossover (CO) of the charged particle lens 4. The second diaphragm 8 may be disposed in the flight tube electrode 9. The position where the second diaphragm 8 is disposed is preferably in the vicinity of the position of the crossover (CO) of the charged particle lens 4. Thereby, ions the emission angles of which are large can be effectively blocked by the blocking part 8b of the second diaphragm 8, and the spatial resolution of the obtained mass image can be further improved.

Although a charged particle image measuring device that makes ions fly as charged particles has been described in this embodiment, charged particles are not limited to ions, and may be electrons or other charged particles.

Modifications

Figure 3A:
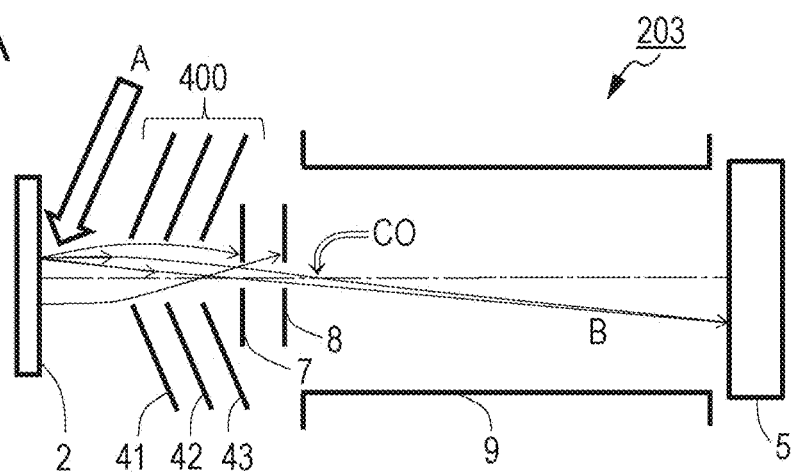
FIG. 3A is a diagram schematically showing the configuration of a charged particle image measuring device according to modification 1 of the first embodiment.
Figure 3B:
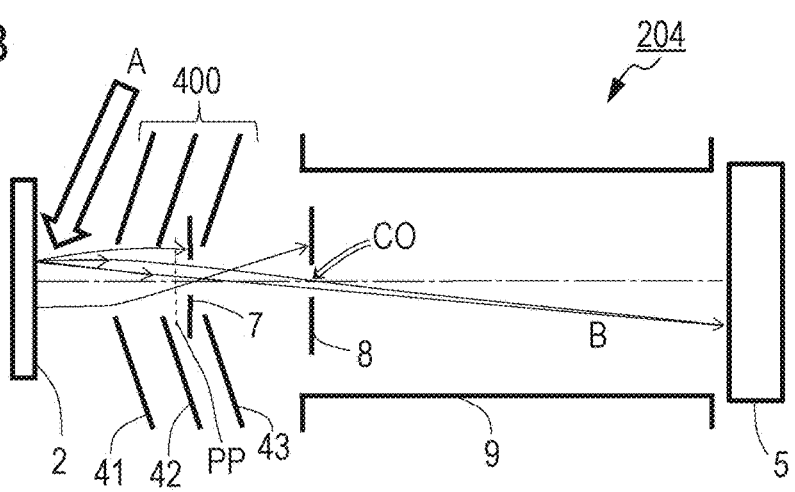
FIG. 3B is a diagram schematically showing the configuration of a charged particle image measuring device according to modification 2 of the first embodiment.
Figure 3C:
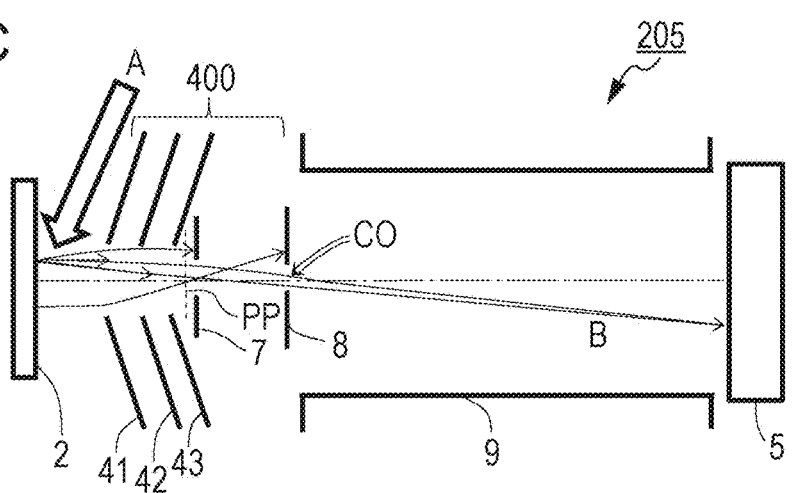
FIG. 3C is a diagram schematically showing the configuration of a charged particle image measuring device according to modification 3 of the first embodiment.

Modifications of this embodiment in which the positions where the first diaphragm 7 and the second diaphragm 8 are disposed are changed are shown in FIGS. 3A to 3C.

FIG. 3A is a diagram schematically showing the configuration of a charged particle image measuring device 203 according to modification 1 of the first embodiment. In modification 1, the first diaphragm 7 is disposed between the position of the crossover (CO) and the charged particle lens 4, and the second diaphragm 8 is disposed between the position of the crossover (CO) and the detector 5.

FIG. 3B is a diagram schematically showing the configuration of a charged particle image measuring device 204 according to modification 2 of the first embodiment. In modification 2, the first diaphragm 7 is disposed between the first lens electrode 42 and the second lens electrode 43, which are lens electrodes forming the charged particle lens 4. In modification 2, the principal plane (PP) of the charged particle lens 4 is located between the first lens electrode 42 and the second lens electrode 43 (FIG. 3B). That is, in modification 2, the principal plane of the charged particle lens 4 is located between two adjacent lens electrodes, and the first diaphragm 7 is disposed between these two lens electrodes. In modification 2, the first diaphragm 7 is disposed in the vicinity of the position of the principal plane of the charged particle lens 4, and the second diaphragm 8 is disposed in the vicinity of the position of the crossover (CO).

FIG. 3C is a diagram schematically showing the configuration of a charged particle image measuring device 205 according to modification 3 of the first embodiment. In modification 3, the first diaphragm 7 is disposed between the position of the crossover (CO) and the charged particle lens 4, and the second diaphragm 8 is disposed in the vicinity of the position of the crossover (CO). In modification 2, the principal plane (PP) of the charged particle lens 4 is located on the downstream side of the second lens electrode 43 (FIG. 3C). That is, as in modification 2, also in modification 3, the first diaphragm 7 is disposed in the vicinity of the position of the principal plane of the charged particle lens 4, and the second diaphragm 8 is disposed in the vicinity of the position of the crossover (CO).

In any of the modifications, the same effect as that of the first embodiment can be obtained.

Ion Optical Simulation

Next, in order to specifically show the effect of an embodiment of the present invention, the result of an ion optical simulation of a mass image measuring device according to the first embodiment will be shown.

Simulation Model

Figure 7A:
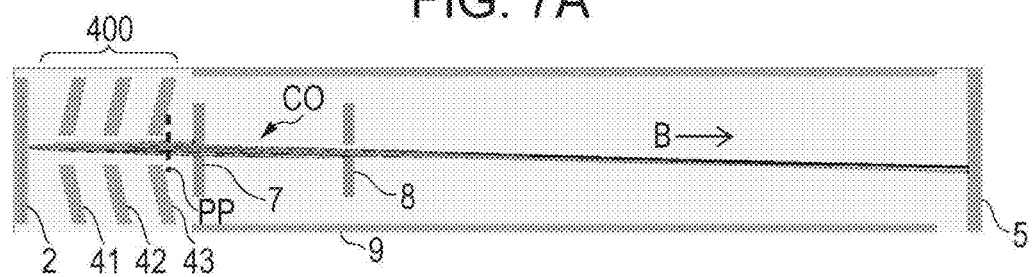
FIG. 7A shows simulation model 1 according to the first embodiment.

As a simulation model for performing an ion optical simulation of a mass image measuring device according to the first embodiment, simulation model 1 shown in FIG. 7A was made. The detail of the configuration of simulation model 1 is as follows.

An extraction electrode 41 was disposed at a position 2 mm from the surface of the sample 2. The extraction electrode 41 was a conical electrode that had a circular opening in an apex part thereof having a diameter of 2 mm and that had an apex angle of 70 degrees. The outside diameter of the bottom part of the cone was 10 mm.

A first lens electrode 42 was disposed on the opposite side of the extraction electrode 41 from the sample 2, that is, on the downstream side of the extraction electrode 41 with a spacing of 2 mm therefrom. A second lens electrode 43 was disposed on the downstream side of the first lens electrode 42 with a spacing of 2 mm therefrom. The shape of the first lens electrode 42 and the second lens electrode 43 is the same as that of the extraction electrode 41. The distances between the above electrodes were defined as the distances between their respective openings.

A flight tube electrode 9 was disposed on the downstream side of the second lens electrode 43 with a spacing of 2 mm therefrom. The flight tube electrode 9 was a cylindrical electrode having an inside diameter of 10 mm and a length of 50 mm. A detector 5 was disposed on the downstream side of the flight tube electrode 9 with a spacing of 2 mm therefrom.

A first diaphragm 7 was disposed on the downstream side of the second lens electrode 43 with a distance of 1 mm therefrom. A second diaphragm 8 was disposed on the downstream side of the first diaphragm 7 with a distance of 10 mm therefrom. The first diaphragm 7 and the second diaphragm 8 were each a disk-shaped electrode having a circular opening (aperture electrode), and the diameter of the opening was 4 mm. The above electrodes and diaphragms were disposed coaxially.

A voltage of 0 V was applied to the sample 2, a voltage of −1000 V was applied to the extraction electrode 41, and a voltage of −3800 V was applied to the first lens electrode 42. A voltage of −1000 V was applied to the second lens electrode 43, the flight tube electrode 9, the first diaphragm 7, the second diaphragm 8, and the detector 5.

Simulation Result

Under the above conditions, the trajectories of positive ions emitted from the sample 2 were calculated by an ion optical simulation. The kinetic energy of positive ions was 5 to 30 eV, and the angle distribution (the distribution of emission angle) in a direction parallel to the plane of the page was −30 to +30 deg with respect to the axis of symmetry of each electrode (the ion optical axis of the charged particle lens 4). The spatial resolution was evaluated by whether or not secondary ions emitted from two points X1 and X2 on the sample 2 can form two separate spots Y1 and Y2 on the detector 5.

Figure 7B:
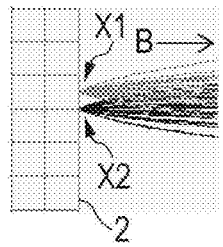
FIG. 7B is an enlarged view of the vicinity of a sample, showing the result of ion optical simulation using simulation model 1.

As shown by thin solid lines B in FIG. 7A, ions emitted from the sample 2 pass through the charged particle lens 4 and are detected by the detector 5. FIG. 7B is an enlarged view of the vicinity of the sample 2. Secondary ions are emitted from the points X1 and X2 on the sample 2, and there is a distribution in the emission angle. It turned out that secondary ions converged on the detector 5, that is, an image of secondary ions emitted from the sample 2 was formed on the detector 5 (FIG. 7A).

Figure 7C:
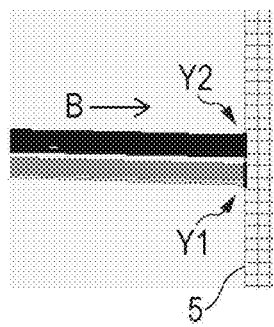
FIG. 7C is an enlarged view (1) of the vicinity of a two-dimensional detector, showing the result of ion optical simulation using simulation model 1.
Figure 7D:
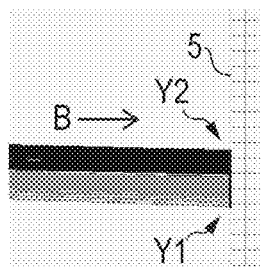
FIG. 7D is an enlarged view (2) of the vicinity of a two-dimensional detector, showing the result of ion optical simulation using simulation model 1.

As a simulation result in the case where the distance LX between X1 and X2 is 0.2 mm, an enlarged view of the vicinity of the detector 5 is shown in FIG. 7C. It turned out that, on this occasion, secondary ions emitted from X1 formed a spot Y1 on the detector 5, secondary ions emitted from X2 formed a spot Y2 on the detector 5, and the spots Y1 and Y2 were formed separately. On the other hand, as a simulation result in the case where the distance LX is 0.1 mm, an enlarged view of the vicinity of the detector 5 is shown in FIG. 7D. It turned out that, on this occasion, the spots Y1 and Y2 formed on the detector 5 overlapped each other and were not separated. Therefore, it can be evaluated that the spatial resolution in the case where diaphragms are disposed is about 0.2 mm.

Figure 7E:
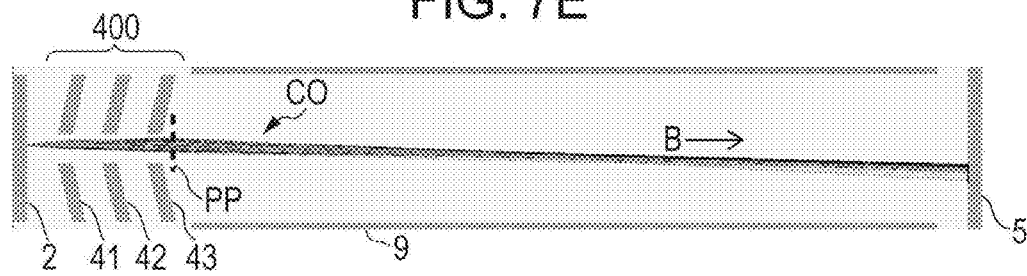
FIG. 7E shows a simulation model not having first and second diaphragms.

Next, the result in the case where the first diaphragm 7 and the second diaphragm 8 are not disposed will be described (FIG. 7E). The simulation model in this case is the same as the above simulation model 1 except that the first diaphragm 7 and the second diaphragm 8 are not disposed.

Figure 7F:
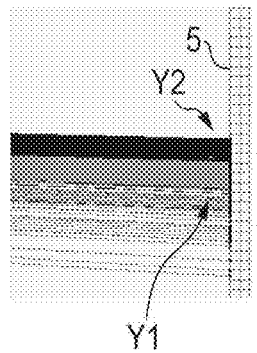
FIG. 7F is an enlarged view of the vicinity of a two-dimensional detector, showing the result of ion optical simulation using the simulation model not having first and second diaphragms.
Figure 7G:
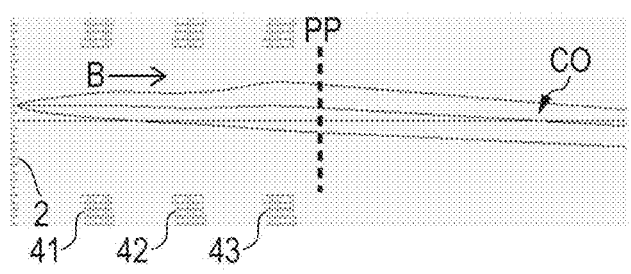
FIG. 7G shows the principal plane and the position of a crossover.

As a simulation result in the case where the distance LX between X1 and X2 is 0.2 mm, an enlarged view of the vicinity of the detector 5 is shown in FIG. 7F. It turned out that, on this occasion, the spots Y1 and Y2 formed on the detector 5 overlapped each other and were not separated. Therefore, it turned out that the spatial resolution was deteriorated compared to the case where the first diaphragm 7 and the second diaphragm 8 are disposed. In other words, the spatial resolution of the obtained mass image was able to be improved by disposing the first diaphragm 7 and the second diaphragm 8 as in this embodiment.

Second Embodiment

A charged particle image measuring device according to a second embodiment will be described with reference to FIGS. 4A to 4C.

Configuration

Figure 4A:
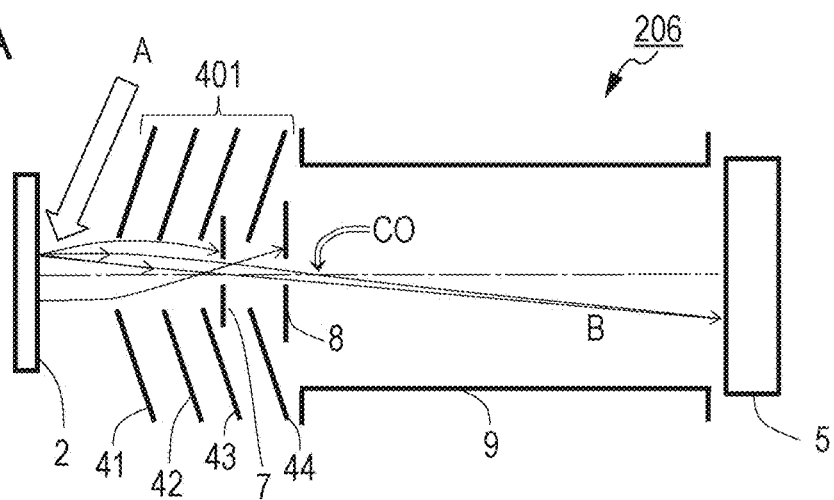
FIG. 4A is a diagram schematically showing the configuration of a charged particle image measuring device according to a second embodiment.

FIG. 4A is a diagram schematically showing the configuration of a charged particle image measuring device according to this embodiment. A charged particle image measuring device 206 according to this embodiment (hereinafter referred to as "image measuring device 206") has a charged particle lens 401 instead of the charged particle lens 400 of the image measuring device 201 according to the first embodiment. Because the configuration other than the charged particle lens 401, the first diaphragm 7, and the second diaphragm 8 is the same as that of the image measuring device 201, the description thereof will be omitted.

The charged particle lens 401 is a fourfold charged particle lens consisting of four electrodes. That is, the charged particle lens 401 has an extraction electrode 41, a first lens electrode 42, a second lens electrode 43, and a third lens electrode 44.

Also in this embodiment, the first diaphragm 7 and the second diaphragm 8 are disposed on a flight path of the secondary ions B through which the secondary ions B emitted from the sample 2 reach the detector 5. The first diaphragm 7 is disposed between the sample stage 3 and the position of a crossover (CO) that is formed by the charged particle lens 4 and that is closest to the sample 2. The second diaphragm 8 is disposed between the first diaphragm 7 and the detector 5.

In this embodiment, as shown in FIG. 4A, the first diaphragm 7 is disposed between the second lens electrode 43 and the third lens electrode 44, which are lens electrodes forming the charged particle lens 4. In this embodiment, the second diaphragm is disposed on the upstream side of the position of the crossover (CO).

By disposing the first diaphragm 7 and the second diaphragm 8 as above, the spatial resolution of the obtained mass image can be improved as in the first embodiment.

Modifications

Figure 4B:
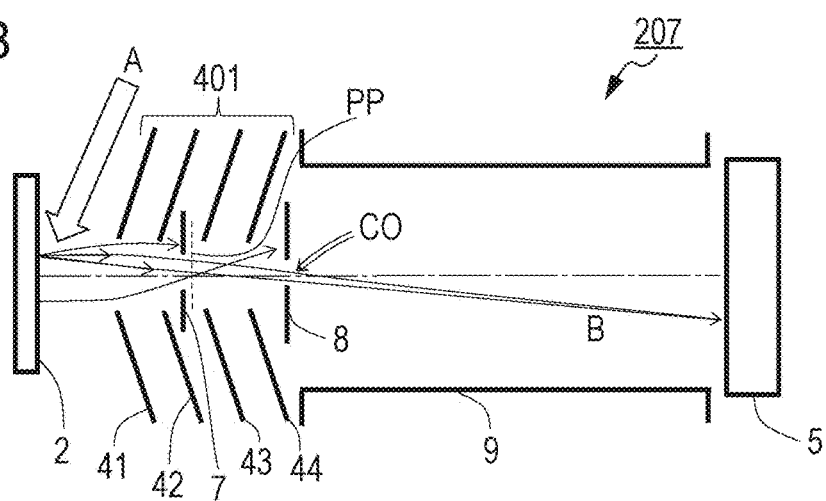
FIG. 4B is a diagram schematically showing the configuration of a charged particle image measuring device according to modification 4 of the second embodiment.
Figure 4C:
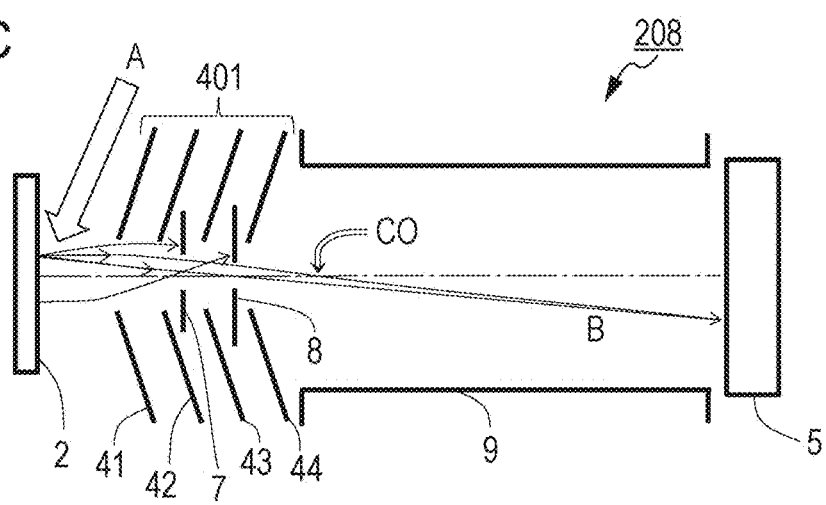
FIG. 4C is a diagram schematically showing the configuration of a charged particle image measuring device according to modification 5 of the second embodiment.

Modifications of this embodiment in which the positions where the first diaphragm 7 and the second diaphragm 8 are disposed are changed are shown in FIGS. 4B to 4C.

FIG. 4B is a diagram schematically showing the configuration of a charged particle image measuring device 207 according to modification 4 of the second embodiment. In modification 4, the first diaphragm 7 is disposed between the first lens electrode 42 and the second lens electrode 43, which are lens electrodes forming the charged particle lens 4. In modification 4, the principal plane (PP) of the charged particle lens 4 is located between the first lens electrode 42 and the second lens electrode 43 (FIG. 4B). That is, in modification 4, the principal plane of the charged particle lens 4 is located between two adjacent lens electrodes, and the first diaphragm 7 is disposed between these two lens electrodes. In modification 4, the first diaphragm 7 is disposed in the vicinity of the position of the principal plane of the charged particle lens 4, and the second diaphragm 8 is disposed in the vicinity of the position of the crossover (CO).

FIG. 4C is a diagram schematically showing the configuration of a charged particle image measuring device 208 according to modification 5 of the second embodiment. In modification 5, the first diaphragm 7 is disposed between the first lens electrode 42 and the second lens electrode 43, which are lens electrodes forming the charged particle lens 4. In modification 5, the second diaphragm 8 is disposed between the second lens electrode 43 and the third lens electrode 44, which are lens electrodes forming the charged particle lens 4. In modification 5, the first diaphragm 7 is disposed between the sample stage 3 and the position of the crossover (CO), and the second diaphragm 8 is disposed between the first diaphragm 7 and the position of the crossover (CO).

In either of the modifications, the same effect as that of the second embodiment can be obtained.

Ion Optical Simulation

Next, in order to specifically show the effect of an embodiment of the present invention, the result of an ion optical simulation of a mass image measuring device according to the second embodiment will be shown.

Simulation Model

Figure 8A:
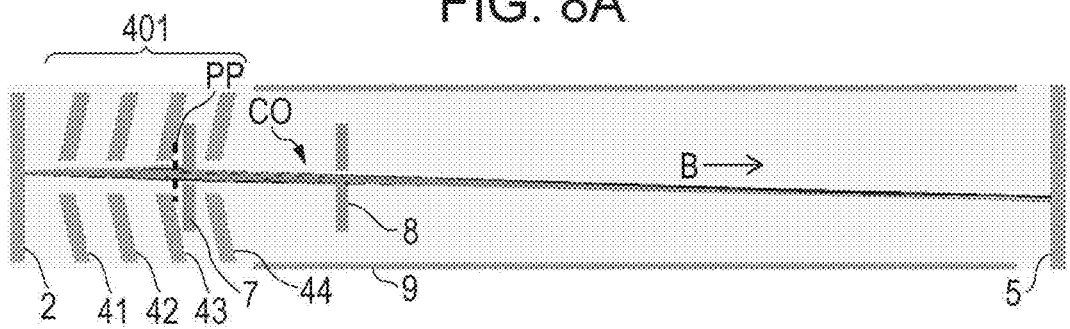
FIG. 8A shows simulation model 2 according to the second embodiment.
Figure 8B:
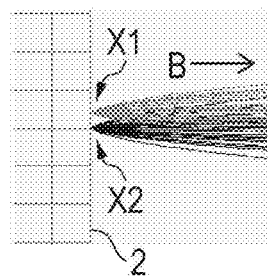
FIG. 8B is an enlarged view of the vicinity of a sample, showing the result of ion optical simulation according to the second embodiment.

As a simulation model for performing an ion optical simulation of a mass image measuring device according to the second embodiment, simulation model 2 shown in FIG. 8A was made. The detail of the configuration of simulation model 2 is as follows.

An extraction electrode 41 was disposed at a position 2 mm from the surface of the sample 2. The extraction electrode 41 was a conical electrode that had a circular opening in an apex part thereof having a diameter of 2 mm and that had an apex angle of 70 degrees. The outside diameter of the bottom part of the cone was 10 mm.

A first lens electrode 42 was disposed on the opposite side of the extraction electrode 41 from the sample 2, that is, on the downstream side of the extraction electrode 41 with a spacing of 2 mm therefrom. A second lens electrode 43 was disposed on the downstream side of the first lens electrode 42 with a spacing of 2 mm therefrom. A third lens electrode 44 was disposed on the downstream side of the second lens electrode 43 with a spacing of 2 mm therefrom. The shape of the first lens electrode 42, the second lens electrode 43, and the third lens electrode 44 is the same as that of the extraction electrode 41. The distances between the above electrodes were defined as the distances between their respective openings.

A flight tube electrode 9 was disposed on the downstream side of the third lens electrode 44 with a spacing of 2 mm therefrom. The flight tube electrode 9 was a cylindrical electrode having an inside diameter of 10 mm and a length of 50 mm. A detector 5 was disposed on the downstream side of the flight tube electrode 9 with a spacing of 2 mm therefrom.

A first diaphragm 7 was disposed on the downstream side of the second lens electrode 43 with a distance of 1 mm therefrom. A second diaphragm 8 was disposed on the downstream side of the first diaphragm 7 with a distance of 10 mm therefrom. The first diaphragm 7 and the second diaphragm 8 were each a disk-shaped electrode having a circular opening (aperture electrode), and the diameter of the opening was 4 mm. The above electrodes and diaphragms were disposed coaxially.

A voltage of 0 V was applied to the sample 2, a voltage of −2000 V was applied to the extraction electrode 41, a voltage of −7550 V was applied to the first lens electrode 42, and a voltage of −2000 V was applied to the second lens electrode 43. A voltage of −1500 V was applied to the third lens electrode 44, the flight tube electrode 9, the first diaphragm 7, the second diaphragm 8, and the detector 5.

Simulation Result

Under the above conditions, the trajectories of positive ions emitted from the sample 2 were calculated by an ion optical simulation as in the first embodiment.

The result of an ion optical simulation in the case where the first diaphragm 7 and the second diaphragm 8 are disposed is shown in FIG. 8A. The principal plane of the charged particle lens 4 is located between the second lens electrode 43 and the third lens electrode 44. Therefore, the first diaphragm 7 is disposed in a space between the second lens electrode 43 and the third lens electrode 44, where the principal plane exists. The second diaphragm 8 is disposed between the position of the crossover (CO) and the detector 5.

Figure 8C:
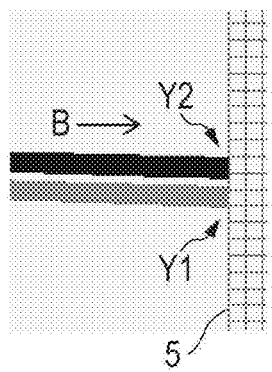
FIG. 8C is an enlarged view (1) of the vicinity of a two-dimensional detector, showing the result of ion optical simulation using simulation model 2.
Figure 8D:
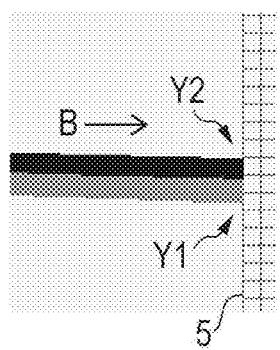
FIG. 8D is an enlarged view (2) of the vicinity of a two-dimensional detector, showing the result of ion optical simulation using simulation model 2.

As a simulation result in the case where the distance LX between X1 and X2 is 0.15 mm, an enlarged view of the vicinity of the detector 5 is shown in FIG. 8C. It turned out that, on this occasion, secondary ions emitted from X1 formed a spot Y1 on the detector 5, secondary ions emitted from X2 formed a spot Y2 on the detector 5, and the spots Y1 and Y2 were formed separately. On the other hand, as a simulation result in the case where the distance LX is 0.1 mm, an enlarged view of the vicinity of the detector 5 is shown in FIG. 8D. It turned out that, on this occasion, the spots Y1 and Y2 formed on the detector 5 overlapped each other and were not separated. Therefore, it can be evaluated that the spatial resolution in the case where diaphragms are disposed is about 0.15 mm.

Next, the result in the case where the first diaphragm 7 and the second diaphragm 8 are not disposed will be described. The simulation model in this case is the same as the above simulation model 2 except that the first diaphragm 7 and the second diaphragm 8 are not disposed.

Figure 8E:
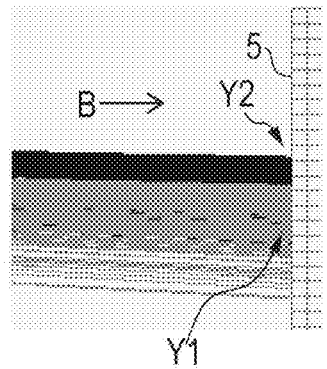
FIG. 8E is an enlarged view of the vicinity of a two-dimensional detector, showing the result of ion optical simulation using a simulation model not having first and second diaphragms.

As a simulation result in the case where the distance LX between X1 and X2 is 0.15 mm, an enlarged view of the vicinity of the detector 5 is shown in FIG. 8E. It turned out that, on this occasion, the spots Y1 and Y2 formed on the detector 5 overlapped each other and were not separated. Therefore, it turned out that the spatial resolution was deteriorated compared to the case where the first diaphragm 7 and the second diaphragm 8 are disposed. In other words, the spatial resolution of the obtained mass image was able to be improved by disposing the first diaphragm 7 and the second diaphragm 8 as in this embodiment.

Third Embodiment

A charged particle image measuring device according to a third embodiment will be described with reference to FIGS. 5A to 5C.

Configuration

Figure 5A:
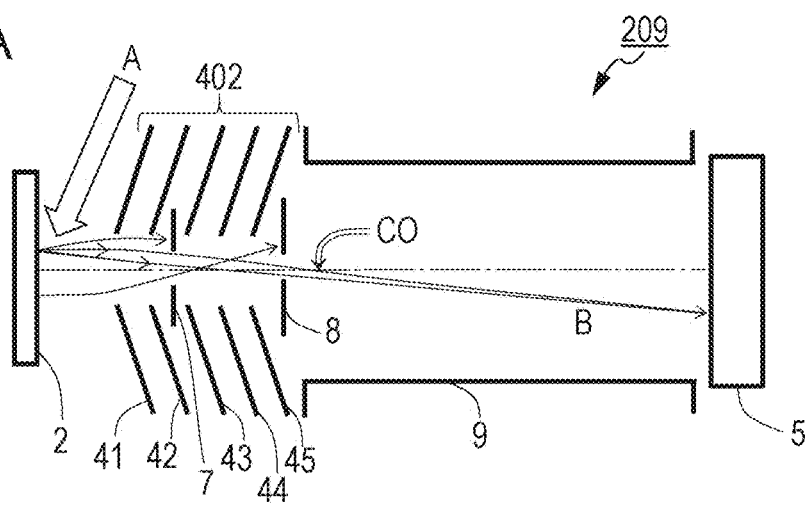
FIG. 5A is a diagram schematically showing the configuration of a charged particle image measuring device according to a third embodiment.

FIG. 5A is a diagram schematically showing the configuration of a charged particle image measuring device according to this embodiment. A charged particle image measuring device 209 according to this embodiment (hereinafter referred to as "image measuring device 209") has a charged particle lens 402 instead of the charged particle lens 400 of the image measuring device 201 according to the first embodiment. Because the configuration other than the charged particle lens 402, the first diaphragm 7, and the second diaphragm 8 is the same as that of the image measuring device 201, the description thereof will be omitted.

The charged particle lens 402 is a fivefold charged particle lens consisting of five electrodes. That is, the charged particle lens 402 has an extraction electrode 41, a first lens electrode 42, a second lens electrode 43, a third lens electrode 44, and a fourth lens electrode 45.

Also in this embodiment, the first diaphragm 7 and the second diaphragm 8 are disposed on a flight path of the secondary ions B through which the secondary ions B emitted from the sample 2 reach the detector 5. The first diaphragm 7 is disposed between the sample stage 3 and the position of a crossover (CO) that is formed by the charged particle lens 4 and that is closest to the sample 2. The second diaphragm 8 is disposed between the first diaphragm 7 and the detector 5.

In this embodiment, as shown in FIG. 5A, the first diaphragm 7 is disposed between the first lens electrode 42 and the second lens electrode 43, which are lens electrodes forming the charged particle lens 4. In this embodiment, the second diaphragm is disposed on the upstream side of the position of the crossover (CO).

By disposing the first diaphragm 7 and the second diaphragm 8 as above, the spatial resolution of the obtained mass image can be improved as in the first embodiment.

Modifications

Figure 5B:
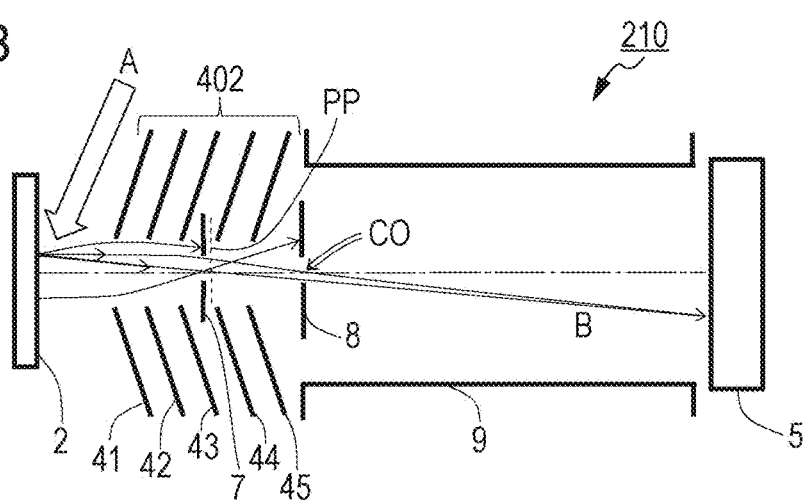
FIG. 5B is a diagram schematically showing the configuration of a charged particle image measuring device according to modification 6 of the third embodiment.
Figure 5C:
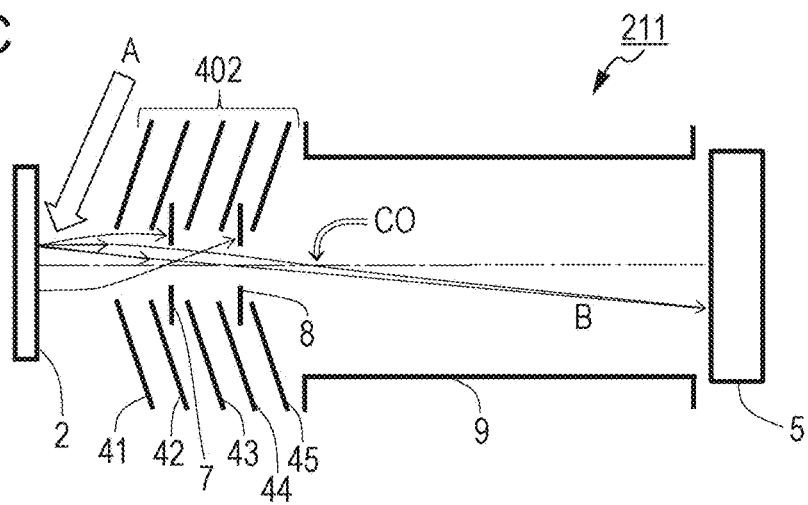
FIG. 5C is a diagram schematically showing the configuration of a charged particle image measuring device according to modification 7 of the third embodiment.

Modifications of this embodiment in which the positions where the first diaphragm 7 and the second diaphragm 8 are disposed are changed are shown in FIGS. 5B to 5C.

FIG. 5B is a diagram schematically showing the configuration of a charged particle image measuring device 210 according to modification 6 of the third embodiment. In modification 6, the first diaphragm 7 is disposed between the second lens electrode 43 and the third lens electrode 44, which are lens electrodes forming the charged particle lens 4. In modification 6, the principal plane (PP) of the charged particle lens 4 is located between the second lens electrode 43 and the third lens electrode 44 (FIG. 5B). That is, in modification 6, the principal plane of the charged particle lens 4 is located between two adjacent lens electrodes, and the first diaphragm 7 is disposed between these two lens electrodes. In modification 6, the first diaphragm 7 is disposed in the vicinity of the position of the principal plane of the charged particle lens 4, and the second diaphragm 8 is disposed in the vicinity of the position of the crossover (CO).

FIG. 5C is a diagram schematically showing the configuration of a charged particle image measuring device 211 according to modification 7 of the third embodiment. In modification 7, the first diaphragm 7 is disposed between the first lens electrode 42 and the second lens electrode 43, which are lens electrodes forming the charged particle lens 4. In modification 7, the second diaphragm 8 is disposed between the third lens electrode 44 and the fourth lens electrode 45, which are lens electrodes forming the charged particle lens 4. In modification 7, the first diaphragm 7 is disposed between the sample stage 3 and the position of the crossover (CO), and the second diaphragm 8 is disposed between the first diaphragm 7 and the position of the crossover (CO).

In either of the modifications, the same effect as that of the first embodiment can be obtained.

Ion Optical Simulation

Next, in order to specifically show the effect of an embodiment of the present invention, the result of an ion optical simulation of a mass image measuring device according to the third embodiment will be shown.

Simulation Model

Figure 9A:
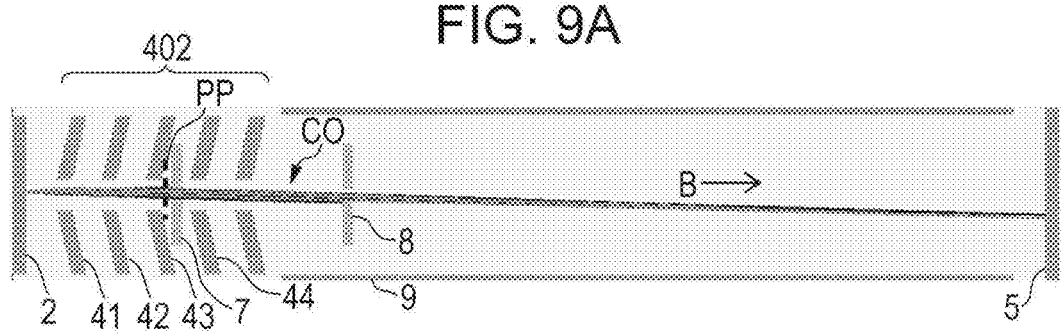
FIG. 9A shows simulation model 3 according to the third embodiment.
Figure 9B:
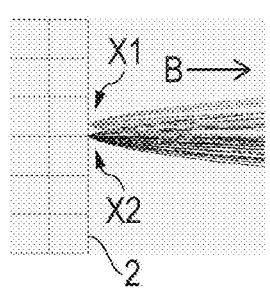
FIG. 9B is an enlarged view of the vicinity of a sample, showing the result of ion optical simulation using simulation model 3.

As a simulation model for performing an ion optical simulation of a mass image measuring device according to the third embodiment, simulation model 3 shown in FIG. 9A was made. The detail of the configuration of simulation model 3 is as follows.

An extraction electrode 41 was disposed at a position 2 mm from the surface of the sample 2. The extraction electrode 41 was a conical electrode that had a circular opening in an apex part thereof having a diameter of 2 mm and that had an apex angle of 70 degrees. The outside diameter of the bottom part of the cone was 10 mm.

A first lens electrode 42 was disposed on the opposite side of the extraction electrode 41 from the sample 2, that is, on the downstream side of the extraction electrode 41 with a spacing of 2 mm therefrom. A second lens electrode 43 was disposed on the downstream side of the first lens electrode 42 with a spacing of 2 mm therefrom. A third lens electrode 44 was disposed on the downstream side of the second lens electrode 43 with a spacing of 2 mm therefrom. A fourth lens electrode 45 was disposed on the downstream side of the third lens electrode 44 with a spacing of 2 mm therefrom.

The shape of the first lens electrode 42, the second lens electrode 43, the third lens electrode 44, and the fourth lens electrode 45 is the same as that of the extraction electrode 41. The distances between the above electrodes were defined as the distances between their respective openings.

A flight tube electrode 9 was disposed on the downstream side of the fourth lens electrode 45 with a spacing of 2 mm therefrom. The flight tube electrode 9 was a cylindrical electrode having an inside diameter of 10 mm and a length of 50 mm. A detector 5 was disposed on the downstream side of the flight tube electrode 9 with a spacing of 2 mm therefrom.

A first diaphragm 7 was disposed on the downstream side of the second lens electrode 43 with a distance of 1 mm therefrom. A second diaphragm 8 was disposed on the downstream side of the first diaphragm 7 with a distance of 40 mm therefrom. The first diaphragm 7 and the second diaphragm 8 were each a disk-shaped electrode having a circular opening (aperture electrode), and the diameter of the opening was 4 mm. The above electrodes and diaphragms were disposed coaxially.

A voltage of 0 V was applied to the sample 2, a voltage of −2000 V was applied to the extraction electrode 41, a voltage of −8500 V was applied to the first lens electrode 42, and a voltage of −3000 V was applied to the second lens electrode 43 and the third lens electrode 44. A voltage of −1500 V was applied to the fourth lens electrode 45, the flight tube electrode 9, the first diaphragm 7, the second diaphragm 8, and the detector 5.

Simulation Result

Under the above conditions, the trajectories of positive ions emitted from the sample 2 were calculated by an ion optical simulation as in the first embodiment.

The result of an ion optical simulation in the case where the first diaphragm 7 and the second diaphragm 8 are disposed is shown in FIG. 9A. The principal plane of the charged particle lens 4 is located between the second lens electrode 43 and the third lens electrode 44. Therefore, the first diaphragm 7 is disposed in a space between the second lens electrode 43 and the third lens electrode 44, where the principal plane exists. The second diaphragm 8 is disposed between the position of the crossover (CO) and the detector 5.

Figure 9C:
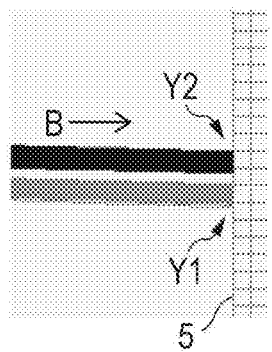
FIG. 9C is an enlarged view (1) of the vicinity of a two-dimensional detector, showing the result of ion optical simulation using simulation model 3.
Figure 9D:
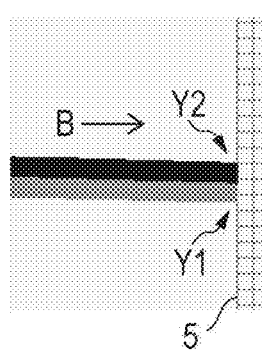
FIG. 9D is an enlarged view (2) of the vicinity of a two-dimensional detector, showing the result of ion optical simulation using simulation model 3.

As a simulation result in the case where the distance LX between X1 and X2 is 0.15 mm, an enlarged view of the vicinity of the detector 5 is shown in FIG. 9C. It turned out that, on this occasion, secondary ions emitted from X1 formed a spot Y1 on the detector 5, secondary ions emitted from X2 formed a spot Y2 on the detector 5, and the spots Y1 and Y2 were formed separately. On the other hand, as a simulation result in the case where the distance LX is 0.1 mm, an enlarged view of the vicinity of the detector 5 is shown in FIG. 9D. It turned out that, on this occasion, the spots Y1 and Y2 formed on the detector 5 overlapped each other and were not separated. Therefore, it can be evaluated that the spatial resolution in the case where diaphragms are disposed is about 0.15 mm.

Next, the result in the case where the first diaphragm 7 and the second diaphragm 8 are not disposed will be described. The simulation model in this case is the same as the above simulation model 3 except that the first diaphragm 7 and the second diaphragm 8 are not disposed.

Figure 9E:
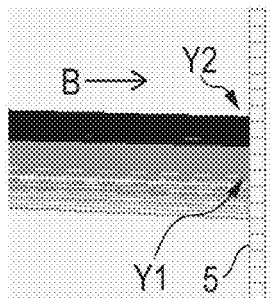
FIG. 9E is an enlarged view of the vicinity of a two-dimensional detector, showing the result of ion optical simulation using a simulation model not having first and second diaphragms.

As a simulation result in the case where the distance LX between X1 and X2 is 0.15 mm, an enlarged view of the vicinity of the detector 5 is shown in FIG. 9E. It turned out that, on this occasion, the spots Y1 and Y2 formed on the detector 5 overlapped each other and were not separated.

Therefore, it turned out that the spatial resolution was deteriorated compared to the case where the first diaphragm 7 and the second diaphragm 8 are disposed. In other words, the spatial resolution of the obtained mass image was able to be improved by disposing the first diaphragm 7 and the second diaphragm 8 as in this embodiment.

Fourth Embodiment

A charged particle image measuring device 212 according to this embodiment is the same as the image measuring device 201 according to the first embodiment except that the charged particle lens 401 is a magnetic field type charged particle lens 403.

Figure 6A:
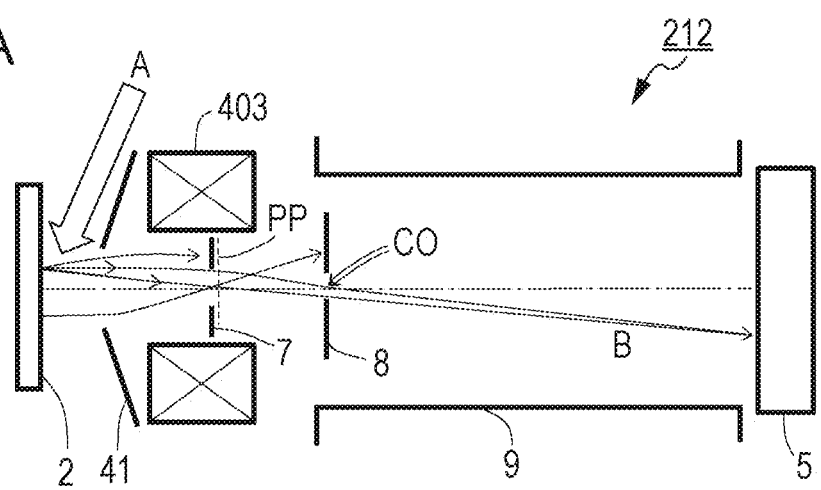
FIG. 6A is a diagram schematically showing the configuration of a charged particle image measuring device according to a fourth embodiment.

As shown in FIG. 6A, the magnetic field type charged particle lens 403 which is a magnetic field lens is placed on the downstream side of the sample 2 with an extraction electrode 41 therebetween. The magnetic field type charged particle lens 403 converges ions by generating a magnetic-field component parallel to the flight direction of ions.

In this embodiment, a first diaphragm 7 is disposed in the vicinity of the position of the principal plane (PP) of the charged particle lens 403, and a second diaphragm 8 is disposed in the vicinity of the position of the crossover (CO) of the charged particle lens 403 (FIG. 6A). The positions where the first diaphragm 7 and the second diaphragm 8 are disposed may be the same as those in the first to third embodiments. Also in this embodiment, the spatial resolution of the charged particle image measuring device is improved by placing the first diaphragm and the second diaphragm.

Fifth Embodiment

Figure 6B:
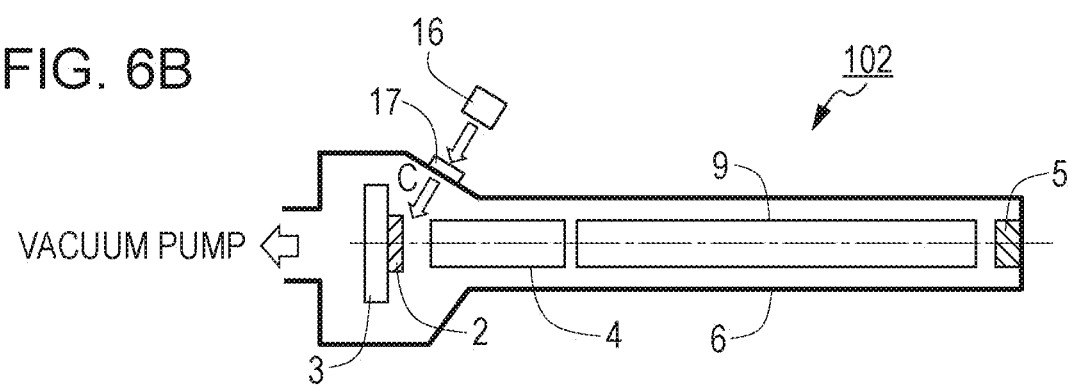
FIG. 6B is a diagram schematically showing the configuration of an imaging mass spectrometry apparatus according to a fifth embodiment.

An imaging mass spectrometry apparatus 102 according to this embodiment (FIG. 6B) is the same as the spectrometry apparatus 101 according to the first embodiment except that it has, as an ionizing portion, a laser light source 16 instead of the ion gun 1.

Laser light C emitted by the laser light source 16 may be any one of ultraviolet laser light, infrared laser light, and visible laser light. Laser light C emitted from the laser light source 16 is incident through an optical window 17 on the sample 2 in the vacuum chamber 6 and causes the sample 2 to emit ions from the surface thereof. The sample 2 may be provided with a matrix material. An ionization method that irradiates a sample 2 provided with a matrix material with laser light is referred to as MALDI (matrix assisted laser desorption ionization).

An image of ions emitted from the sample 2 is formed on the detector 5 by the charged particle lens 4 as in the first embodiment. In this embodiment, the laser light C is pulsed, and therefore ions are emitted in a pulsed manner. Therefore, the elapsed time from when the sample 2 is irradiated with the laser light C until ions are detected by the detector 5 is the time of flight.

Imaging mass spectrometry can be performed by forming an image of ions emitted from the sample 2 on the detector 5 by the irradiation of laser light C and measuring the time of flight as described above.

The imaging mass spectrometry apparatus 102 can accurately measure the mass-to-charge ratio even when the projection magnification is changed, and in addition, can sensitively detect macromolecules such as biomolecules by irradiating a sample provided with a matrix material with laser light.

While an embodiment of the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-173269, filed Sep. 2, 2015, and Japanese Patent Application No. 2016-153915, filed Aug. 4, 2016, which are hereby incorporated by reference herein in their entirety.

What is claimed is:

1. A charged particle image measuring device comprising:
    a sample stage;
    a charged particle lens opposite the sample stage;
    a two-dimensional detector;
    a first diaphragm disposed between the sample stage and a position of a crossover that is formed by the charged particle lens and that is closest to a sample; and
    a second diaphragm disposed between the first diaphragm and the two-dimensional detector.

2. The charged particle image measuring device according to claim 1,
    wherein the charged particle lens has a plurality of lens electrodes, and
    wherein a principal plane of the charged particle lens is located between two of the plurality of lens electrodes that are adjacent to each other, and the first diaphragm is disposed between the two adjacent lens electrodes.

3. The charged particle image measuring device according to claim 2, wherein the second diaphragm is disposed between the rearmost one of the plurality of lens electrodes forming the charged particle lens and the two-dimensional detector.

4. The charged particle image measuring device according to claim 1, wherein the second diaphragm is disposed between the charged particle lens and the two-dimensional detector.

5. The charged particle image measuring device according to claim 1, wherein the second diaphragm is disposed in the vicinity of the position of the crossover.

6. The charged particle image measuring device according to claim 1, further comprising a flight tube electrode between the charged particle lens and the two-dimensional detector.

7. The charged particle image measuring device according to claim 1, wherein the charged particle lens is an electrostatic lens.

8. The charged particle image measuring device according to claim 1, wherein the charged particle lens is a magnetic field lens.

9. An imaging mass spectrometry apparatus comprising:
    the charged particle image measuring device according to claim 1; and
    an ionizing portion configured to ionize the sample held by the sample stage and to cause the sample to emit charged particles.

10. The imaging mass spectrometry apparatus according to claim 9, wherein the ionizing portion is an ion gun configured to irradiate the sample with an ion beam.

11. The imaging mass spectrometry apparatus according to claim 9, wherein the ionizing portion is a cluster ion gun configured to irradiate the sample with a cluster ion beam.

12. The imaging mass spectrometry apparatus according to claim 9, wherein the ionizing portion is a laser light source configured to irradiate the sample with laser light.

13. A charged particle image measuring device comprising:
    a sample stage configured to hold a sample;
    a two-dimensional detector;

a charged particle lens disposed opposite the sample stage and configured to converge charged particles emitted from the sample and to form an image of the charged particles emitted from the sample on the two-dimensional detector;

a first diaphragm disposed between the sample stage and a position of a crossover that is formed by the charged particle lens and that is closest to the sample and configured to block at least some of the charged particles emitted from the sample; and a second diaphragm disposed between the first diaphragm and the two-dimensional detector and configured to block at least some of the charged particles passing through the first diaphragm.

14. The charged particle image measuring device according to claim 13, wherein the charged particle lens has a plurality of lens electrodes, and wherein a principal plane of the charged particle lens is located between two of the plurality of lens electrodes that are adjacent to each other, and the first diaphragm is disposed between the two adjacent lens electrodes.

15. The charged particle image measuring device according to claim 13, wherein the second diaphragm is disposed in the vicinity of the position of the crossover.

* * * * *